(12) United States Patent
Komuro et al.

(10) Patent No.: US 6,989,723 B2
(45) Date of Patent: Jan. 24, 2006

(54) PIEZOELECTRIC RESONANT FILTER AND DUPLEXER

(75) Inventors: Eiju Komuro, Tokyo (JP); Hisatoshi Saitou, Tokyo (JP); Takao Noguchi, Tokyo (JP); Hidenori Abe, Tokyo (JP)

(73) Assignee: TDK Corporation, Tokyo (JP)

( * ) Notice: Subject to any disclaimer, the term of this patent is extended or adjusted under 35 U.S.C. 154(b) by 49 days.

(21) Appl. No.: 10/731,157

(22) Filed: Dec. 10, 2003

(65) Prior Publication Data

US 2004/0113720 A1    Jun. 17, 2004

(30) Foreign Application Priority Data

Dec. 11, 2002    (JP)    ............................ 2002-359027

(51) Int. Cl.
H03H 9/54    (2006.01)
H03H 9/70    (2006.01)

(52) U.S. Cl. ...................................... 333/133; 333/189

(58) Field of Classification Search ........ 333/186–192, 333/133
See application file for complete search history.

(56) References Cited

U.S. PATENT DOCUMENTS

| | | | | |
|---|---|---|---|---|
| 4,456,850 A | * | 6/1984 | Inoue et al. | 310/324 |
| 5,910,756 A | * | 6/1999 | Ella | 333/133 |
| 6,051,907 A | * | 4/2000 | Ylilammi | 310/312 |
| 6,307,447 B1 | * | 10/2001 | Barber et al. | 333/189 |
| 6,407,649 B1 | * | 6/2002 | Tikka et al. | 333/133 |
| 6,441,539 B1 | * | 8/2002 | Kitamura et al. | 310/346 |
| 6,556,103 B2 | * | 4/2003 | Shibata et al. | 333/187 |

FOREIGN PATENT DOCUMENTS

| | | |
|---|---|---|
| EP | 0 818 883 | 1/1998 |
| EP | 1 024 547 | 8/2000 |
| EP | 1 058 383 | 12/2000 |
| EP | 1 100 196 | 5/2001 |
| JP | 58-137317 | 8/1983 |
| JP | 58-153412 | 9/1983 |
| JP | 59-141813 | 8/1984 |
| JP | 60-68711 | 4/1985 |
| JP | 60-171822 | 6/1985 |
| JP | 60-189307 | 9/1985 |
| JP | 9-64683 | 3/1997 |
| JP | 2001-502136 | 2/2001 |

OTHER PUBLICATIONS

K. M. Lakin, TFR Technologies, Technical Report, XP-002276553, pp. 1-18, "Thin Film Resonators and High Frequency Filters", Jun. 1, 2001.

(Continued)

Primary Examiner—Barbara Summons
(74) Attorney, Agent, or Firm—Oblon, Spivak, McClelland, Maier & Neustadt, P.C.

(57) ABSTRACT

A piezoelectric resonant filter includes a group of series resonators and a group of parallel resonators for forming a ladder-type filter circuit. Each of the resonators has a piezoelectric thin film having piezoelectric characteristic, and lower and upper electrodes disposed on opposite surfaces of the piezoelectric thin film for applying an excitation voltage to the piezoelectric thin film. The group of the parallel resonators exhibits a low frequency side attenuation extremum in the filter whereas the group of the series resonators exhibits a high frequency side attenuation extremum in the filter. At least one of the group of the series resonators and the group of the parallel resonators has a temperature compensating layer for bringing the temperature coefficient of the resonant frequency close to zero.

20 Claims, 5 Drawing Sheets

OTHER PUBLICATIONS

K. M. Lakin, IEEE Ultrasonics Symposium, vol. 1, XP-002276554, pp. 855-858, "Temperature Compensated Bulk Acoustic Thin Film Resonators", Oct. 22-25, 2000.

N. Shibagaki, et al., IEEE Ultrasonics Symposium, XP-010139551, pp. 129-134, "New Design Procedures and Experimental Results of Saw Filters for Duplexers Considering Wide Temperature Range", Nov. 1-4, 1994.

Kiyoshi Nakamura, et al., "Thin Film Resonators and Filter", International Symposium on Acoustic Wave Devices for Future Mobile Communication Systems, Collected Papers, Mar. 5-7, 2001, pp. 93-99.

"Low Loss Ladder Type IF Saw Filter", Jun. 2002, pp. 39-44 (cited in the Taiwanese Office Action Feb. 3, 2005), Partial Translation of cited reference enclosed.

* cited by examiner

PIEZOELECTRIC RESONANT FILTER AND DUPLEXER

BACKGROUND OF THE INVENTION

The present invention relates to a piezoelectric resonant filter containing thin-film piezoelectric resonators, and a duplexer containing such piezoelectric resonant filters.

In mobile communication apparatuses such as cellular phones that have been spread remarkably in recent years, both reduction in size and increase in working frequency have advanced year by year. For this reason, both reduction in size and increase in workable frequency have been required of electronic components used in the mobile communication apparatuses.

Some mobile communication apparatus has a duplexer for performing switching between a transmission signal path and a reception signal path so that one antenna can be used for both transmission and reception. The duplexer has a transmission filter for passing a transmission signal but cutting off a reception signal, and a reception filter for passing the reception signal but cutting off the transmission signal.

A surface acoustic wave filter has been often used as each of the filters in the duplexer in recent years. The surface acoustic wave filter can support frequencies up to several GHz and is characterized in that the size of the filter can be reduced compared with a ceramic filter. In the present situation, however, many technical problems still remain in order to adapt the surface acoustic wave filter to the frequency that will be worked as a higher frequency in the mobile communication apparatus in the future.

Therefore, a thin-film piezoelectric resonator called thin-film bulk acoustic resonator has recently attracted public attention (see below mentioned Patent Documents 1 to 8 and Non-Patent Document 1). The thin-film piezoelectric resonator is a resonator using resonance in a direction of the thickness of a piezoelectric thin film. In the thin-film piezoelectric resonator, the resonant frequency can vary according to the change of the thickness of the piezoelectric thin film. It is conceived that the thin-film piezoelectric resonator can support frequencies up to several GHz. The concept "resonant frequency" used in this specification includes an antiresonant frequency except the case where the term "resonant frequency" is used particularly in comparison with the term "antiresonant frequency".

The thin-film piezoelectric resonator has a piezoelectric thin film, a pair of electrodes disposed on opposite surfaces of the piezoelectric thin film, and a substrate for supporting the piezoelectric thin film and the pair of electrodes. The substrate may have a cave provided so as to be opened at a surface opposite to a surface on which the piezoelectric thin film and the pair of electrodes are disposed (see Patent Documents 1 and 2). Or a gap may be provided between the substrate and one of the electrodes (see Patent Document 3). Or the piezoelectric thin film and the pair of electrodes may be disposed on the substrate with interposition of an acoustic multi-layer film without provision of the cave and the gap (see Non-Patent Document 1).

For example, a ladder-type filter is a filter using resonators. The ladder-type filter includes series resonators and parallel resonators for forming a basic structure. As occasion demands, the ladder-type filter may be constituted by cascade connection of a plurality of portions each having a basic structure.

If no measure is taken, the resonant frequency of the thin-film piezoelectric resonator generally varies according to temperature change. This property is hereinafter referred to as temperature characteristic of resonant frequency. The temperature characteristic of resonant frequency is exhibited because the elastic constant of a typical piezoelectric material such as ZnO, CdS or AlN used in the piezoelectric thin film varies according to temperature change.

For example, in a thin-film piezoelectric resonator using ZnO as a piezoelectric thin film material, the temperature coefficient of resonant frequency is about −60 ppm/° C. Incidentally, the temperature coefficient of resonant frequency means the rate of change of resonant frequency in accordance with temperature change.

As a method for bringing the temperature coefficient of the resonant frequency in the thin-film piezoelectric resonator close to zero, there has been heretofore known a method in which a thin film (hereinafter referred to as temperature compensating film) made of a material having a temperature coefficient of elastic constant inverse in terms of plus/minus sign to the temperature coefficient of elastic constant of the piezoelectric thin film material is added to the thin-film piezoelectric resonator (see Patent Documents 1, 2 and 4). Incidentally, the temperature coefficient of elastic constant means the rate of change of elastic constant in accordance with temperature change. For example, $SiO_2$ can be used as the material of the temperature compensating film.

When the temperature compensating film is added to the thin-film piezoelectric resonator, the temperature coefficient of the resonant frequency of the thin-film piezoelectric resonator varies according to the thickness of the temperature compensating film. Accordingly, when the thickness of the temperature compensating film added to the thin-film piezoelectric resonator is optimized, the temperature coefficient of the resonant frequency of the thin-film piezoelectric resonator can be brought close to zero.

Patent Document 5 has described a technique which is used in a thin-film piezoelectric resonator having such a structure that a lower electrode, a piezoelectric thin film and an upper electrode are formed successively on a substrate and by which a film made of an electrically insulating material such as $SiO_2$ is provided between a lead-out portion of the upper electrode and the piezoelectric thin film. This technique aims at reduction of capacitance between the lead-out portion of the upper electrode and the substrate.

Patent Document 6 has described a technique which is used in a piezoelectric thin-film resonator having such a structure that a lower electrode, a piezoelectric thin film and an upper electrode are formed successively on a substrate and by which a dielectric layer made of a dielectric material such as $SiO_2$ is provided on the substrate so that the effective thickness of the dielectric layer varies according to the place. This technique aims at reduction of capacitance between the lower electrode/upper electrode and the substrate.

Patent Document 7 has described a technique which is used in a lattice filter containing a plurality of thin-film resonators and by which a film is provided on part of the resonators so that mass load can be applied on the part of the resonators. The film is provided for changing the resonant frequency of each resonator by a predetermined value. In Patent Document 7, silicon oxide has been described as an example of the material of the film.

Patent Document 8 has described a technique which is used in a piezoelectric thin-film resonator including a thin film made of $SiO_2$ and by which a frequency exhibiting at least one of series resonance and parallel resonance is measured and the thickness of the thin film is changed so that the difference between the measured frequency and a reference frequency is minimized.

[Patent Document 1]

Japanese Patent Laid-Open No. 137317/1983

[Patent Document 2]

Japanese Patent Laid-Open No. 153412/1983

[Patent Document 3]

Japanese Patent Laid-Open No. 189307/1985 (pages 2 and 3 and FIGS. 3 and 4)

[Patent Document 4]

Japanese Patent Laid-Open No. 68711/1985 (pages 2 and 3 and FIGS. 3 and 4)

[Patent Document 5]

Japanese Patent Laid-Open No. 141813/1984 (pages 2 and 3 and FIGS. 3 and 4)

[Patent Document 6]

Japanese Patent Laid-Open No. 171822/1985 (page 2 and FIGS. 3 and 4)

[Patent Document 7]

Japanese Patent Laid-Open No. 64683/1997 (pages 4 and 5 and FIGS. 4 and 5)

[Patent Document 8]

International Patent Publication No. 2001-502136 (page 15 and FIG. 6A)

[Non-Patent Document 1]

Kiyoshi Nakamura et al., "Thin Film Resonators and Filters", International Symposium on Acoustic Wave Devices for Future Mobile Communication Systems, Collected Papers, pp.93–99, Mar. 5–7, 2001

A ladder-type filter has frequency characteristic exhibiting a low frequency side attenuation extremum and a high frequency side attenuation extremum disposed on opposite sides of a pass band. The resonant frequency of parallel resonators coincides with a frequency exhibiting the low frequency side attenuation extremum. The antiresonant frequency of series resonators coincides with a frequency exhibiting the high frequency side attenuation extremum. Accordingly, in the filter using thin-film piezoelectric resonators as the series and parallel resonators, there is a problem that the pass band of the filter varies according to temperature change when the resonant frequency of each thin-film piezoelectric resonator varies according to temperature change.

In a duplexer, when the pass band of the transmission filter or the pass band of the reception filter varies according to temperature change, the following problem occurs. Incidentally, the following description will be made on the assumption that the frequency band of the transmission signal is lower than the frequency band of the reception signal. In this case, particularly variation in the frequency of the transmission filter exhibiting the high frequency side attenuation extremum and variation in the frequency of the reception filter exhibiting the low frequency side attenuation extremum become issues. This is because variations in these frequencies cause lowering of performance of the duplexer for separating the transmission signal and the reception signal from each other.

It may be therefore conceived that a temperature compensating film having an optimal thickness is added to each of the thin-film piezoelectric resonators included in each filter in order to bring the temperature coefficient of the resonant frequency of each thin-film piezoelectric resonator close to zero.

An $SiO_2$ thin film often used as the temperature compensating film is however amorphous and has no piezoelectric characteristic. For this reason, when the temperature compensating film of $SiO_2$ is added to each thin-film piezoelectric resonator, the electromechanical coupling factor of the resonators as a whole decreases as the thickness of the temperature compensating film increases. As a result, the pass band width of each filter including the thin-film piezoelectric resonators is reduced.

Heretofore, in a filter including a plurality of thin-film piezoelectric resonators, for example, a temperature compensating film has been provided on the whole of the filter at the time of addition of the temperature compensating film to each thin-film piezoelectric resonator. In this case, reduction in the pass band width of the filter due to the provision of the temperature compensating film cannot be suppressed.

As described in Patent Document 4, the temperature compensating film may be provided only on a partial region of the substrate including a region where the thin-film piezoelectric resonators are disposed. Also in this case, the temperature compensating film having a uniform thickness is provided for all the thin-film piezoelectric resonators in the filter. Accordingly, also in this case, reduction in the pass bandwidth of the filter caused by the provision of the temperature compensating film cannot be suppressed.

In the technique described in Patent Document 5, a film made of an electrically insulating material such as $SiO_2$ is provided on a region except a vibration portion of a thin-film piezoelectric vibrator. For this reason, this film does not function as a temperature compensating film.

In the technique described in Patent Document 6, the effective thickness of a dielectric layer is selected to vary according to the place. The thickness of the dielectric layer provided on a region where a thin-film piezoelectric resonator is disposed is however uniform. When $SiO_2$ is used as the material of the dielectric layer, the dielectric layer provided on the region where the thin-film piezoelectric resonator is disposed can function as a temperature compensating film. When this technique is applied to a filter including a plurality of thin-film piezoelectric resonators, the dielectric layer having such a uniform thickness is provided for all the thin-film piezoelectric resonators. For this reason, in this case, reduction in the pass band width of the filter caused by the provision of the dielectric layer cannot be suppressed.

In the technique described in Patent Document 7, a film giving mass load is provided for changing the resonant frequency of a resonator by a predetermined value. For this reason, even in the case where silicon oxide is used as the material of the film, the thickness of the film cannot be optimized to bring the temperature coefficient of the resonant frequency of the resonator close to zero.

In the technique described in Patent Document 8, the thickness of a thin film is selected so that the difference between a measured frequency and a reference frequency is minimized. For this reason, even in the case where $SiO_2$ is used as the material of the thin film, the thickness of the thin film cannot be optimized to bring the temperature coefficient of the resonant frequency of the resonator close to zero.

SUMMARY OF THE INVENTION

The invention is developed in consideration of the problems and an object of the invention is to provide a piezoelectric resonant filter in which drawbacks caused by variation in the pass band of the filter in accordance with temperature change can be prevented while reduction in width of the pass band can be suppressed, and a duplexer including such piezoelectric resonant filters.

A piezoelectric resonant filter according to the invention includes a plurality of thin-film piezoelectric resonators each including a piezoelectric thin film having piezoelectric characteristic, and a pair of excitation electrodes disposed on opposite surfaces of the piezoelectric thin film for applying an excitation voltage to the piezoelectric thin film. The piezoelectric resonant filter has frequency characteristic exhibiting a low frequency side attenuation extremum and a high frequency side attenuation extremum arranged on opposite sides of a pass band. In the piezoelectric resonant filter according to the invention, a first frequency at which the low frequency side attenuation extremum appears is different, in rate of frequency change in accordance with temperature change, from a second frequency at which the high frequency side attenuation extremum appears.

In the piezoelectric resonant filter according to the invention, the rate of frequency change according to temperature change at one of the first frequency and the second frequency is lower than the rate of frequency change according to temperature change at the other frequency.

In the piezoelectric resonant filter according to the invention, the plurality of thin-film piezoelectric resonators may be a combination of a group of series resonators and a group of parallel resonators for forming a ladder-type filter circuit. The group of the series resonators exhibits the high frequency side attenuation extremum whereas the group of the parallel resonators exhibits the low frequency side attenuation extremum. At least one of the group of the series resonators and the group of the parallel resonators has a temperature compensating layer for bringing the rate of resonant frequency change in accordance with temperature change close to zero. The thickness of the temperature compensating layer in the group of the series resonators may be different from the thickness of the temperature compensating layer in the group of the parallel resonators. Incidentally, the invention also includes the case where either the thickness of the temperature compensating layer in the group of the series resonators or the thickness of the temperature compensating layer in the group of the parallel resonators is zero.

In the piezoelectric resonant filter according to the invention, the temperature compensating layer may be made of silicon dioxide ($SiO_2$). In the piezoelectric resonant filter according to the invention, each of the thin-film piezoelectric resonators may include an acoustic multi-layer film having a plurality of layers different in acoustic impedance and disposed on a surface of one of the excitation electrodes opposite to the piezoelectric thin film so that the excitation electrode is sandwiched between the acoustic multi-layer film and the piezoelectric thin film. Part of the plurality of layers in the acoustic multi-layer film may serve as part of the temperature compensating layer.

Each of first, second and third duplexers according to the invention includes a transmission filter for passing a transmission signal but cutting off a reception signal, and a reception filter for passing the reception signal but cutting off the transmission signal. Each of the first, second and third duplexers is connected to an antenna. The transmission filter has frequency characteristic exhibiting a first low frequency side attenuation extremum and a first high frequency side attenuation extremum arranged on opposite sides of a first pass band. The reception filter has frequency characteristic exhibiting a second low frequency side attenuation extremum and a second high frequency side attenuation extremum arranged on opposite sides of a second pass band different from the first pass band.

In the first duplexer according to the invention, the transmission filter as at least one of the transmission filter and the reception filter includes a plurality of thin-film piezoelectric resonators. Each of the thin-film piezoelectric resonators has a piezoelectric thin film having piezoelectric characteristic, and a pair of excitation electrodes disposed on opposite surfaces of the piezoelectric thin film for applying an excitation voltage to the piezoelectric thin film.

In the first duplexer according to the invention, the rate of frequency change in accordance with temperature change at a frequency which is one nearer to the second pass band out of a frequency exhibiting the first low frequency side attenuation extremum and a frequency exhibiting the first high frequency side attenuation extremum is lower than the rate of frequency change in accordance with temperature change at the other frequency.

In the first duplexer according to the invention, the plurality of thin-film piezoelectric resonators in the transmission filter may be a combination of a group of series resonators and a group of parallel resonators for forming a ladder-type filter circuit. The group of the series resonators exhibits the first high frequency side attenuation extremum whereas the group of the parallel resonators exhibits the first low frequency side attenuation extremum. At least one of the group of the series resonators and the group of the parallel resonators may have a temperature compensating layer for bringing the rate of resonant frequency change in accordance with temperature change close to zero. The thickness of the temperature compensating layer in the group of the series resonators may be different from the thickness of the temperature compensating layer in the group of the parallel resonators. Incidentally, the invention also includes the case where either the thickness of the temperature compensating layer in the group of the series resonators or the thickness of the temperature compensating layer in the group of the parallel resonators is zero.

In the second duplexer according to the invention, the reception filter as at least one of the transmission filter and the reception filter includes a plurality of thin-film piezoelectric resonators. Each of the thin-film piezoelectric resonators has a piezoelectric thin film having piezoelectric characteristic, and a pair of excitation electrodes disposed on opposite surfaces of the piezoelectric thin film for applying an excitation voltage to the piezoelectric thin film.

In the second duplexer according to the invention, the rate of frequency change in accordance with temperature change at a frequency which is one nearer to the first pass band out of a frequency exhibiting the second low frequency side attenuation extremum and a frequency exhibiting the second high frequency side attenuation extremum is lower than the rate of frequency change in accordance with temperature change at the other frequency.

In the second duplexer according to the invention, the plurality of thin-film piezoelectric resonators in the reception filter may be a combination of a group of series resonators and a group of parallel resonators for forming a ladder-type filter circuit. The group of the series resonators exhibits the second high frequency side attenuation extremum whereas the group of the parallel resonators exhibits the second low frequency side attenuation extremum. At least one of the group of the series resonators and the group of the parallel resonators may have a temperature compensating layer for bringing the rate of resonant frequency change in accordance with temperature change close to zero. The thickness of the temperature compensating layer in the group of the series resonators may be different from the thickness of the temperature compensating layer in the group of the parallel resonators. Incidentally, the invention also includes the case where either the thickness of the temperature compensating layer in the group of the series resonators or the thickness of the temperature compensating layer in the group of the parallel resonators is zero.

In the third duplexer according to the invention, each of the transmission filter and the reception filter includes a plurality of thin-film piezoelectric resonators. Each of the thin-film piezoelectric resonators has a piezoelectric thin film having piezoelectric characteristic, and a pair of excitation electrodes disposed on opposite surfaces of the piezoelectric thin film for applying an excitation voltage to the piezoelectric thin film.

In the third duplexer according to the invention, the rate of frequency change in accordance with temperature change at a frequency which is one nearer to the second pass band out of a frequency exhibiting the first low frequency side attenuation extremum and a frequency exhibiting the first high frequency side attenuation extremum is lower than the rate of frequency change in accordance with temperature change at the other frequency.

In the third duplexer according to the invention, the rate of frequency change in accordance with temperature change at a frequency which is one nearer to the first pass band out of a frequency exhibiting the second low frequency side attenuation extremum and a frequency exhibiting the second high frequency side attenuation extremum is lower than the rate of frequency change in accordance with temperature change at the other frequency.

In the third duplexer according to the invention, the plurality of thin-film piezoelectric resonators in the transmission filter may be a combination of a group of first series resonators and a group of first parallel resonators for forming a ladder-type filter circuit. The group of the first series resonators exhibits the first high frequency side attenuation extremum whereas the group of the first parallel resonators exhibits the first low frequency side attenuation extremum. At least one of the group of the first series resonators and the group of the first parallel resonators may have a temperature compensating layer for bringing the rate of resonant frequency change in accordance with temperature change close to zero. The thickness of the temperature compensating layer in the group of the first series resonators may be different from the thickness of the temperature compensating layer in the group of the first parallel resonators. Incidentally, the invention also includes the case where either the thickness of the temperature compensating layer in the group of the first series resonators or the thickness of the temperature compensating layer in the group of the first parallel resonators is zero.

Similarly, in the third duplexer according to the invention, the plurality of thin-film piezoelectric resonators in the reception filter may be a combination of a group of second series resonators and a group of second parallel resonators for forming a ladder-type filter circuit. The group of the second series resonators exhibits the second high frequency side attenuation extremum whereas the group of the second parallel resonators exhibits the second low frequency side attenuation extremum. At least one of the group of the second series resonators and the group of the second parallel resonators may have a temperature compensating layer for bringing the rate of resonant frequency change in accordance with temperature change close to zero. The thickness of the temperature compensating layer in the group of the second series resonators may be different from the thickness of the temperature compensating layer in the group of the second parallel resonators. Incidentally, the invention also includes the case where either the thickness of the temperature compensating layer in the group of the second series resonators or the thickness of the temperature compensating layer in the group of the second parallel resonators is zero.

In each of the first, second and third duplexers according to the invention, the temperature compensating layer may be made of silicon dioxide. In each of the first, second and third duplexers according to the invention, each of the thin-film piezoelectric resonators may include an acoustic multi-layer film having a plurality of layers different in acoustic impedance and disposed on a surface of one of the excitation electrodes opposite to the piezoelectric thin film so that the excitation electrode is sandwiched between the acoustic multi-layer film and the piezoelectric thin film. Part of the plurality of layers in the acoustic multi-layer film may serve as part of the temperature compensating layer.

BRIEF DESCRIPTION OF THE PREFERRED EMBODIMENTS

DETAILED DESCRIPTION OF THE PREFERRED EMBODIMENTS

Figure 4:
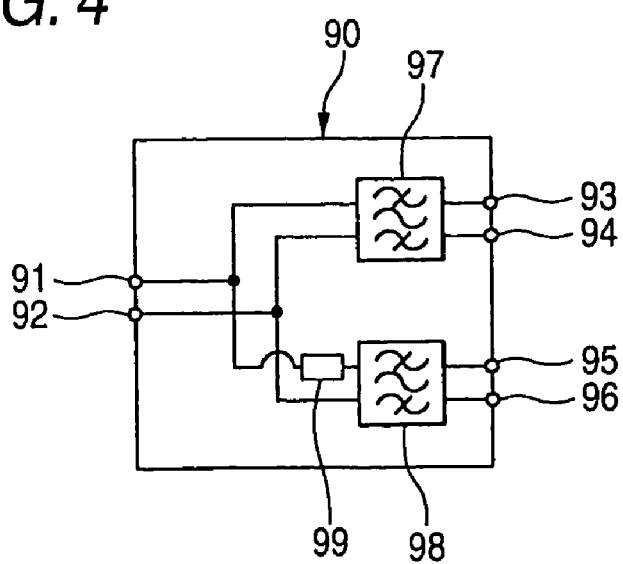
FIG. 4 is a circuit diagram of the duplexer according to the embodiment of the invention.

An embodiment of the invention will be described below in detail with reference to the drawings. Referring to FIG. 4, the configuration of a duplexer according to an embodiment of the invention will be described first. FIG. 4 is a circuit diagram of the duplexer according to this embodiment. The duplexer 90 according to this embodiment has antenna terminals 91 and 92 connected to a not-shown antenna, transmission signal terminals 93 and 94 connected to a not-shown transmission circuit for outputting a transmission signal to the antenna, and reception signal terminals 95 and 96 connected to a not-shown reception circuit for inputting a reception signal from the antenna.

The duplexer 90 further has a transmission filter 97 for passing the transmission signal but cutting off the reception signal, and a reception filter 98 for passing the reception signal but cutting off the transmission signal. Each of the filters 97 and 98 has two input terminals, and two output terminals.

The two input terminals of the transmission filter 97 are connected to the transmission signal terminals 93 and 94 respectively. The two output terminals of the transmission filter 97 are connected to the antenna terminals 91 and 92 respectively. One of the two input terminals of the reception filter 98 is connected to the antenna terminal 91 through a quarter-wave phase shifter 99. The other input terminal of the reception filter 98 is connected to the antenna terminal 92. The two output terminals of the reception filter 98 are connected to the reception signal terminals 95 and 96 respectively.

A transmission signal supplied from the transmission circuit is delivered to the antenna through the transmission filter 97. A reception signal caught in the antenna is delivered to the not-shown reception circuit through the reception filter 98 after the phase of the reception signal is shifted by a quarter wavelength through the quarter-wave phase shifter 99.

As will be described later in detail, each of the transmission filter 97 and the reception filter 98 is constituted by a piezoelectric resonant filter according to this embodiment.

Figure 5:
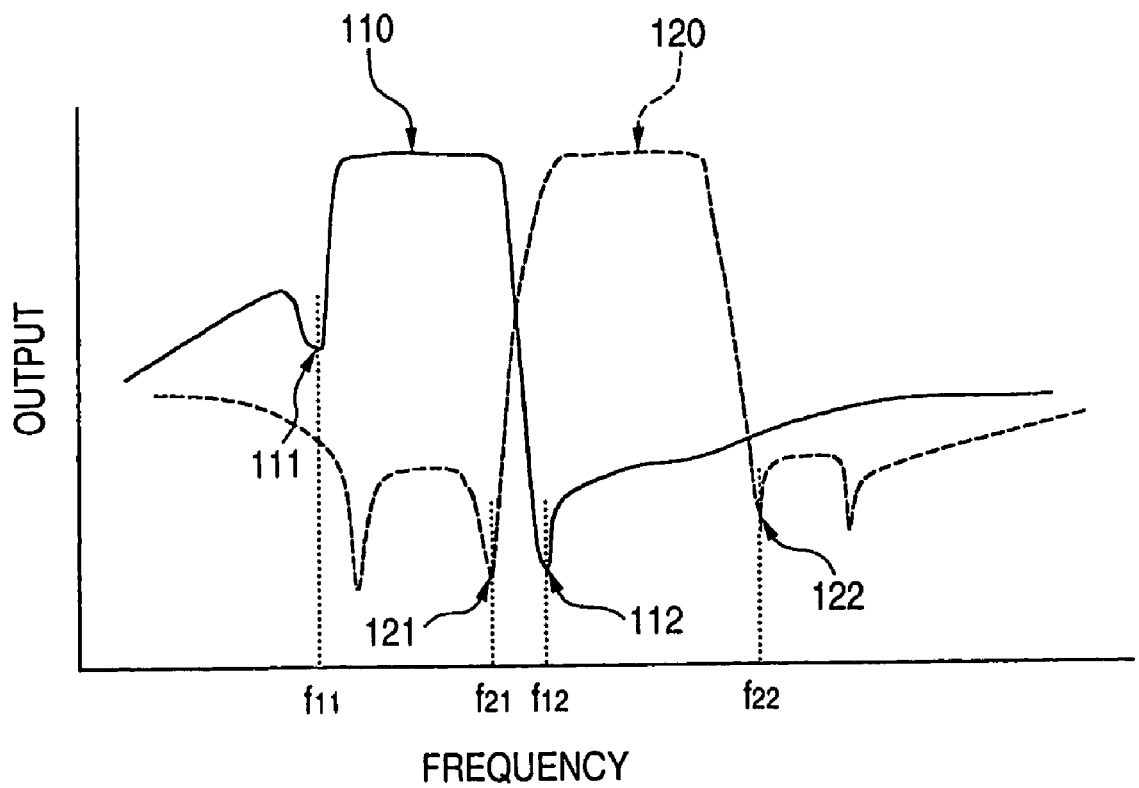
FIG. 5 is a characteristic graph showing an example of frequency characteristic of the duplexer according to the embodiment of the invention.

FIG. 5 is a characteristic graph showing an example of frequency characteristic of the duplexer 90 according to this embodiment. FIG. 5 shows frequency characteristic in the signal level output from the filter 97 or 98 in the case where a signal having a predetermined level is input to the transmission filter 97 or the reception filter 98 in the duplexer 90. In FIG. 5, the reference numeral 110 designates frequency characteristic in the signal level output from the transmission filter 97; and 120, frequency characteristic in the signal level output from the reception filter 98.

In this example, the transmission filter 97 has frequency characteristic exhibiting a first low frequency side attenuation extremum 111 and a first high frequency side attenuation extremum 112 disposed on opposite sides of a predetermined first pass band. The reception filter 98 has frequency characteristic exhibiting a second low frequency side attenuation extremum 121 and a second high frequency side attenuation extremum 122 disposed on opposite sides of a second pass band different from the first pass band. In this example, the first pass band is located so as to be lower in frequency than the second pass band.

Assume now that frequencies exhibiting the attenuation extrema 111, 112, 121 and 122 are expressed as $f_{11}$, $f_{12}$, $f_{21}$ and $f_{22}$ respectively. The first pass band is located between the frequencies $f_{11}$ and $f_{12}$. However, the first pass band is not always identical to the frequency region between the frequencies $f_{11}$ and $f_{12}$. When, for example, the first pass band is provided as a band between two frequencies at which the level of the output signal is lower by 3 dB than the maximum level, the first pass band is narrower than the frequency region between the frequencies $f_{11}$ and $f_{12}$. Similarly, the second pass band is located between the frequencies $f_{21}$ and $f_{22}$ but is not always identical to the frequency region between the frequencies $f_{21}$ and $f_{22}$.

Next, circuit configurations of the piezoelectric filters according to the invention, that is, circuit configurations of the transmission filter 97 and the reception filter 98 will be described with reference to FIGS. 1 and 2.

Figure 1:
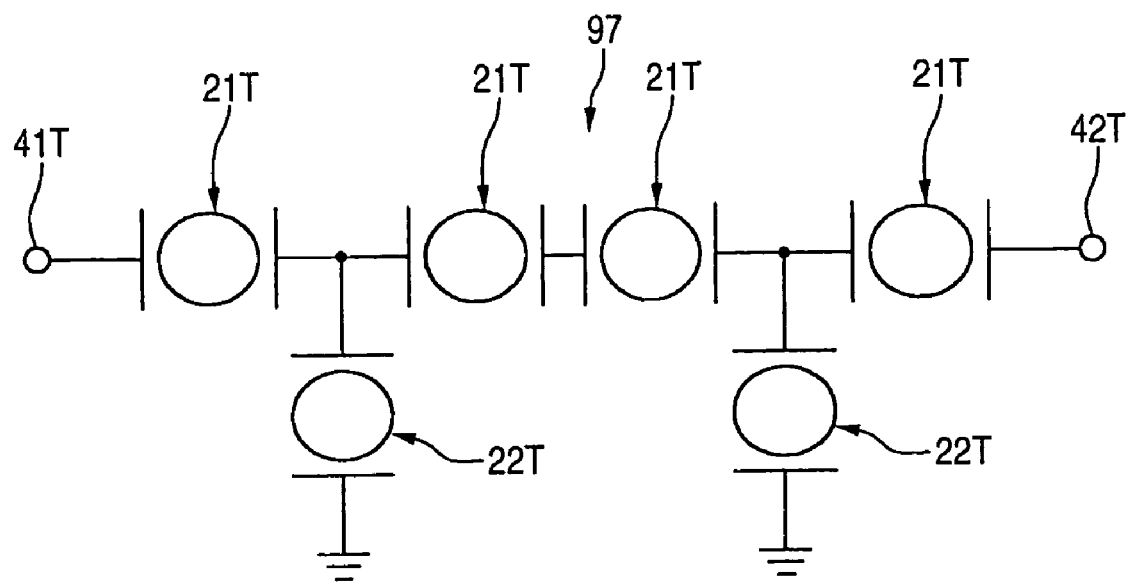
FIG. 1 is a circuit diagram showing an example of circuit configuration of a transmission filter in a duplexer according to an embodiment of the invention.

FIG. 1 is a circuit diagram showing an example of circuit configuration of the transmission filter 97. The transmission filter 97 has an input end 41T, and an output end 42T. The transmission filter 97 further has first to fourth series resonators 21T and first and second parallel resonators 22T for forming a ladder-type filter circuit. Each of the resonators 21T and 22T is a thin-film piezoelectric resonator. One end of the first series resonator 21T is connected to the input end 41T. The other end of the first series resonator 21T is connected to one end of the second series resonator 21T. The other end of the second series resonator 21T is connected to one end of the third series resonator 21T. The other end of the third series resonator 21T is connected to one end of the fourth series resonator 21T. The other end of the fourth series resonator 21T is connected to the output end 42T.

One end of the first parallel resonator 22T is connected to a junction between the first and second series resonators 21T. The other end of the first parallel resonator 22T is grounded. One end of the second parallel resonator 22T is connected to a junction between the third and fourth series resonators 21T. The other end of the second parallel resonator 22T is grounded.

Figure 2:
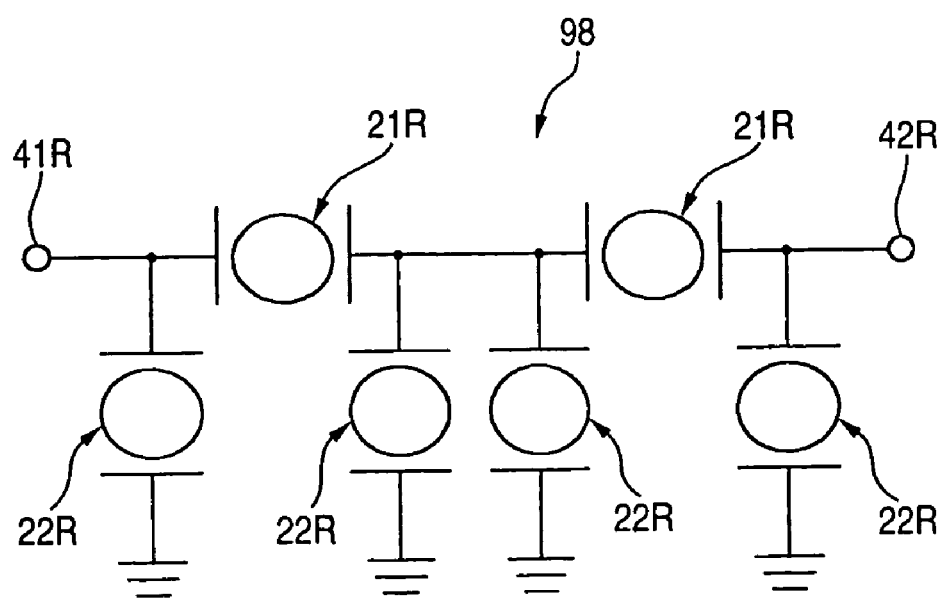
FIG. 2 is a circuit diagram showing an example of circuit configuration of a reception filter in the duplexer according to the embodiment of the invention.

FIG. 2 is a circuit diagram showing an example of circuit configuration of the reception filter 98. The reception filter 98 has an input end 41R, and an output end 42R. The reception filter 98 further has first and second series resonators 21R and first to fourth parallel resonators 22R for forming a ladder-type filter circuit. Each of the resonators 21R and 22R is a thin-film piezoelectric resonator. One end of the first series resonator 21R is connected to the input end 41R. The other end of the first series resonator 21R is connected to one end of the second series resonator 21R. The other end of the second series resonator 21R is connected to the output end 42R.

One end of the first parallel resonator 22R is connected to the one end of the first series resonator 21R. One end of the second parallel resonator 22R is connected to the other end of the first series resonator 21R. One end of the third parallel resonator 22R is connected to the one end of the second series resonator 21R. One end of the fourth parallel resonator 22R is connected to the other end of the second series resonator 21R. The other ends of the first to fourth parallel resonators 22R are grounded.

Incidentally, the circuit configurations of the transmission filter 97 and the reception filter 98 are not limited to the configurations shown in FIGS. 1 and 2 respectively. For example, each of the circuit configurations of the transmission filter 97 and the reception filter 98 may be a configuration obtained by removal of the second and fourth series resonators 21T from the circuit shown in FIG. 1 or a configuration obtained by removal of the first and third series resonators 21T from the circuit shown in FIG. 1.

Each of the circuits shown in FIGS. 1 and 2 is formed by cascade connection of two basic structural portions. The invention may be however applied to the case where each of the circuit configurations of the transmission filter 97 and the reception filter 98 is formed by one basic structural portion or by cascade connection of three or more basic structural portions.

Each thin-film piezoelectric resonator has a piezoelectric thin film having piezoelectric characteristic, and two excitation electrodes disposed on opposite surfaces of the piezoelectric thin film for applying an excitation voltage to the piezoelectric thin film. The specific configuration of the thin-film piezoelectric resonator will be described later in detail.

Figure 3A:
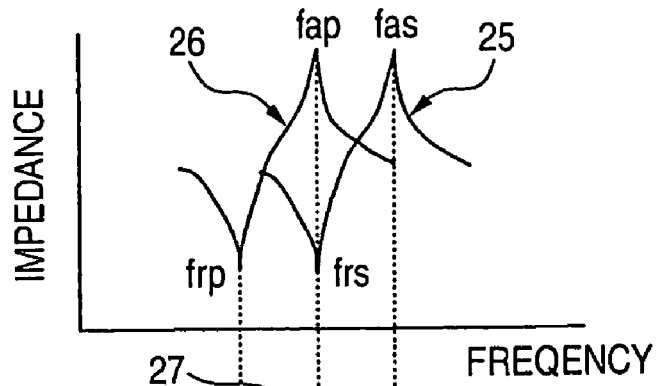
FIGS. 3A and 3B are views for explaining frequency characteristics of piezoelectric resonant filters in the embodiment of the invention.
Figure 3B:
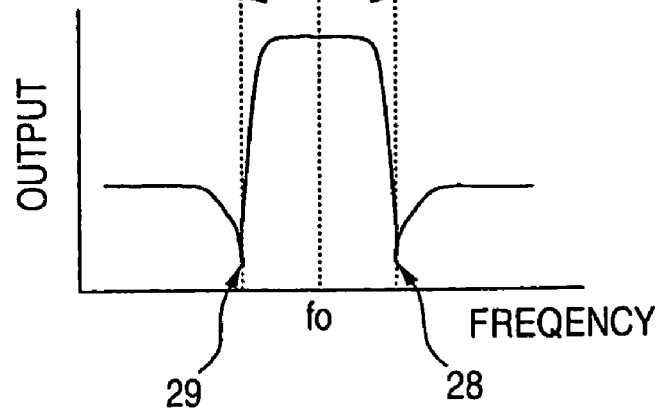

The frequency characteristic of each piezoelectric resonant filter according to this embodiment will be described with reference to FIGS. 3A and 3B. FIG. 3A conceptually shows impedance-frequency characteristics of series resonators 21 (in which the reference numeral 21 represents the reference numerals 21T and 21R) and parallel resonators 22 (in which the reference numeral 22 represents the reference numerals 22T and 22R). In FIG. 3A, the reference numeral 25 designates impedance-frequency characteristic of the series resonators 21; and 26, impedance-frequency characteristic of the parallel resonators 22. FIG. 3B conceptually shows output signal level-frequency characteristic of the piezoelectric resonant filter in the case where a signal having a predetermined level is input into the piezoelectric resonant filter.

In this embodiment, as shown in FIGS. 3A and 3B, the resonant frequency $f_{rs}$ of each series resonator 21 and the antiresonant frequency $f_{ap}$ of each parallel resonator 22 are made coincident with the center frequency $f_0$ of a required pass band 27 of the piezoelectric resonant filter. The parallel resonator 22 exhibits a low frequency side attenuation extremum 29 whereas the series resonator 21 exhibits a high frequency side attenuation extremum 28. That is, the resonant frequency $f_{rp}$ of the parallel resonator 22 coincides with a frequency at which the low frequency side attenuation extremum 29 appears whereas the antiresonant frequency $f_{as}$ of the series resonator 21 coincides with a frequency at which the high frequency side attenuation extremum 28 appears. In FIGS. 3A and 3B, the pass band 27 of the piezoelectric resonant filter is defined as a frequency range of from the resonant frequency $f_{rp}$ of the parallel resonator 22 to the antiresonant frequency $f_{as}$ of the series resonator 21.

As is obvious from FIGS. 3A and 3B, the pass band 27 of the piezoelectric resonant filter depends on the resonant frequencies (inclusive of antiresonant frequencies) of the resonators 21 and 22. For this reason, when the resonant frequencies of the resonators 21 and 22 vary according to temperature change, the pass band 27 of the piezoelectric resonant filter varies according to temperature change.

Figure 6:
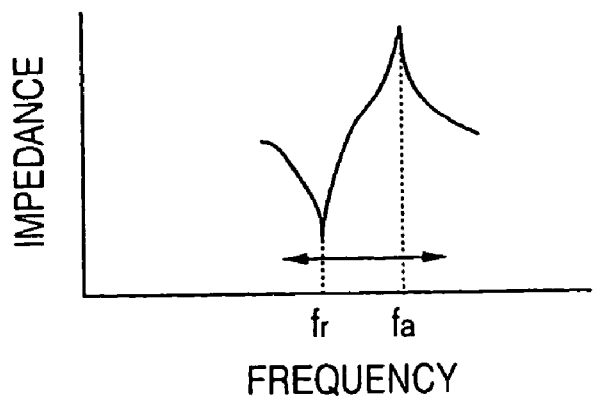
FIG. 6 is a graph for explaining temperature characteristic of resonant frequency of each thin-film piezoelectric resonator in the embodiment of the invention.

Temperature characteristic at the resonant frequency of a thin-film piezoelectric resonator forming each of the resonators 21 and 22 will be described with reference to FIG. 6. FIG. 6 conceptually shows impedance-frequency characteristic of the thin-film piezoelectric resonator. In FIG. 6, $f_r$ expresses the resonant frequency of the thin-film piezoelectric resonator, and $f_a$ expresses the antiresonant frequency of the thin-film piezoelectric resonator. If no measure is taken, the frequencies $f_r$ and $f_a$ of the thin-film piezoelectric resonator shift to a high frequency side or a low frequency side in accordance with temperature change. The rate of change of the resonant frequency according to temperature change is referred to as temperature coefficient of the resonant frequency. When the resonant frequency shifts to a high frequency side in accordance with increase in temperature, the temperature coefficient of the resonant frequency has a positive value. When the resonant frequency shifts to a low frequency side in accordance with increase in temperature, the temperature coefficient of the resonant frequency has a negative value.

The temperature coefficient of the resonant frequency depends on the temperature coefficient of elastic constant of the material of a thin film for forming a vibration portion of the thin-film piezoelectric resonator. This will be described below in detail. When v is the speed of wave propagated through the thin film, that is, sonic speed, λ is the wavelength of the wave and f is the frequency of the wave, these variables have the relation given by the following expression (1).

$$v = f\lambda \quad (1)$$

Assume further that k is the elastic constant of the material of the thin film and ρ is the density of the material of the thin film. These k and ρ and the sonic velocity v have the relation given to the following expression (2).

$$v = \sqrt{(k/\rho)} \quad (2)$$

The following expression (3) can be obtained on the basis of the expressions (1) and (2).

$$f = (1/\lambda)\sqrt{(k/\rho)} \quad (3)$$

It is obvious from the expression (3) that the frequency f is proportional to a square root of the elastic constant k. On the other hand, the elastic constant depends on temperature. When the temperature coefficient of the elastic constant has a positive value, the temperature coefficient of the resonant frequency also has a positive value. On the contrary, when the temperature coefficient of the elastic constant has a negative value, the temperature coefficient of the resonant frequency also has a negative value.

The elastic constant and the temperature coefficient of the elastic constant are values peculiar to a substance. For example, Patent Document 2 has described "the temperature coefficient of elastic stiffness $C_{33}^E$ is negative in ZnO and Si and positive in SiO$_2$". In this manner, ZnO and SiO$_2$ are inverse to each other in terms of plus/minus sign of the temperature coefficient of elastic stiffness $C_{33}^E$ which is an elastic constant. Accordingly, when, for example, the material of the piezoelectric thin film in the thin-film piezoelectric resonator is ZnO, a temperature compensating layer made of SiO$_2$ may be provided so that the temperature coefficient of the resonant frequency of the thin-film piezoelectric resonator can be brought close to zero.

Although the temperature characteristic of the resonant frequency of the thin-film piezoelectric resonator is exhibited on the basis of the temperature dependence of the elastic constant of the material of the thin film, it may be also exhibited on the basis of difference between thermal expansion coefficients of a plurality of films for forming the thin-film piezoelectric resonator.

In the piezoelectric resonant filter according to this embodiment, that is, in each of the transmission filter 97 and the reception filter 98, at least one of the group of the series resonators 21 and the group of the parallel resonators 22 has a temperature compensating layer so that the rate of change of the resonant frequency in accordance with temperature change can be brought close to zero. The temperature compensating layer is made of a material having a temperature coefficient of elastic constant inverse in terms of plus/minus sign to the temperature coefficient of elastic constant of the material of the piezoelectric thin film. In this embodiment, the thickness of the temperature compensating layer in each series resonator 21 is different from the thickness of the temperature compensating layer in each parallel resonator 22. As a result, in the piezoelectric resonant filter according to this embodiment, the frequency at which the low frequency side attenuation extremum 29 appears and the frequency at which the high frequency side attenuation extremum 28 appears are different from each other in the rate of frequency change in accordance with temperature change. Incidentally, in this embodiment, either the thickness of the temperature compensating layer in each series resonator 21 or the thickness of the temperature compensating layer in each parallel resonator 22 may be zero. In other words, one of the group of the series resonators 21 and the group of the parallel resonators 22 need not have the temperature compensating layer.

Figure 7:
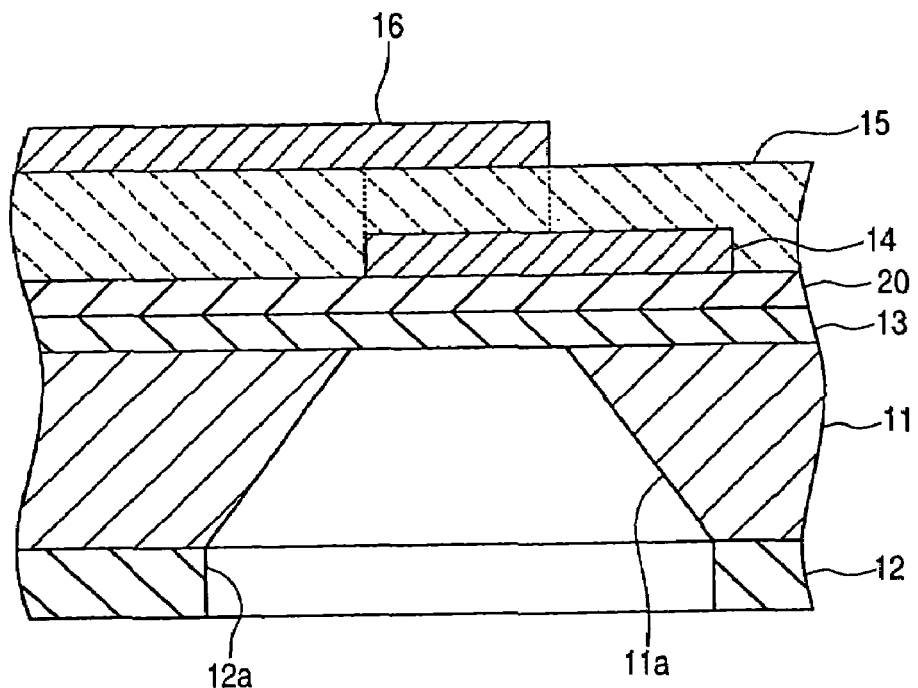
FIG. 7 is a sectional view showing an example of configuration of each thin-film piezoelectric resonator in the embodiment of the invention.

Next, an example of configuration of the thin-film piezoelectric resonator in this embodiment will be described with reference to FIG. 7. FIG. 7 is a sectional view of the thin-film piezoelectric resonator according to this embodiment. The thin-film piezoelectric resonator shown in FIG. 7 includes a substrate 11, a lower barrier layer 12 disposed so as to be adjacent to a lower surface of the substrate 11, an upper barrier layer 13 disposed so as to be adjacent to an upper surface of the substrate 11, and a temperature compensating layer 20 disposed so as to be adjacent to an upper surface of the upper barrier layer 13. The thin-film piezoelectric resonator further includes a lower electrode 14 disposed on the temperature compensating layer 20, a piezoelectric thin film 15 disposed on the lower electrode 14, and an upper electrode 16 disposed on the piezoelectric thin film 15.

The substrate 11 is provided for supporting other constituent members of the thin-film piezoelectric resonator. The substrate 11 is provided with a cave 11a. For example, an Si substrate is used as the substrate 11.

The lower barrier layer 12 is used as a mask for forming the cave 11a in the substrate 11. Therefore, an opening portion 12a is formed in the lower barrier layer 12 and at a place corresponding to the cave 11a. For example, silicon nitride ($SiN_x$) is used as the material of the lower barrier layer 12.

The upper barrier layer 13 is an electrically insulating layer by which the substrate 11 and the temperature compensating layer 20 are separated from each other. For example, silicon nitride ($SiN_x$) is used as the material of the upper barrier layer 13.

The temperature compensating layer 20 is made of a material having a temperature coefficient of elastic constant inverse in terms of plus/minus sign to the temperature coefficient of elastic constant of the material of the piezoelectric thin film 15. For example, silicon dioxide ($SiO_2$) is used as the material of the temperature compensating layer 20. Incidentally, as described above, in this embodiment, one of the group of the series resonators 21 and the group of the parallel resonators 22 need not have the temperature compensating layer 20.

The piezoelectric thin film 15 is a thin film having piezoelectric characteristic. For example, ZnO is used as the material of the piezoelectric thin film 15. The lower electrode 14 and the upper electrode 16 are mainly made of metals respectively. For example, Pt is used as the material of the lower electrode 14 whereas Al is used as the material of the upper electrode 16.

The upper electrode 16 is disposed at a place corresponding to the cave 11a of the substrate 11. Accordingly, the lower electrode 14 and the upper electrode 16 are opposite to each other with respect to the piezoelectric thin film 15.

Although FIG. 7 shows the case where the cave 11a is formed in the substrate 11 by way of example, a cavity may be formed in the upper surface of the substrate 11 so that a space is formed between the upper barrier layer 13 and the substrate 11.

Although FIG. 7 shows the case where the temperature compensating layer 20 is disposed on the upper barrier layer 13 by way of example, the temperature compensating layer 20 may be disposed between the upper electrode 16 and the piezoelectric thin film 15 or on the upper electrode 16.

Next, the operation of the duplexer 90 having piezoelectric resonant filters according to this embodiment will be described. In the duplexer 90, the transmission filter 97 passes a transmission signal but cuts off a reception signal whereas the reception filter 98 passes the reception signal but cuts off the transmission signal. The transmission filter 97 has frequency characteristic exhibiting a first low frequency side attenuation extremum 111 and a first high frequency side attenuation extremum 112 disposed on opposite sides of a predetermined first pass band. The reception filter 98 has frequency characteristic exhibiting a second low frequency side attenuation extremum 121 and a second high frequency side attenuation extremum 122 disposed on opposite sides of a second pass band different in the first pass band.

Each of the filters 97 and 98 has series resonators 21 and parallel resonators 22 for forming a ladder-type filter circuit. The series resonators 21 exhibit the high frequency side attenuation extrema whereas the parallel resonators 22 exhibit the low frequency side attenuation extrema.

In each of the resonators 21 and 22, a high frequency excitation voltage is applied between the lower electrode 14 and the upper electrode 16. The high frequency excitation voltage is applied to the piezoelectric thin film 15. As a result, a portion which is part of the piezoelectric thin film 15 and which is disposed between the lower electrode 14 and the upper electrode 16 is excited so that longitudinal wave advancing in the direction of the thickness of the piezoelectric thin film 15 is generated in this portion. This portion resonates when the frequency of the excitation voltage is a required resonant frequency.

Incidentally, as described above, in this embodiment, the thickness of the temperature compensating layer 20 in each series resonator 21 is different from the thickness of the temperature compensating layer 20 in each parallel resonator 22. Next, the thickness of the temperature compensating layer 20 will be described in detail while the case where the duplexer 90 has frequency characteristic shown in FIG. 5 is taken as an example.

First, in the transmission filter 97, the thickness of the temperature compensating layer 20 in each series resonator 21T is larger than the thickness of the temperature compensating layer 20 in each parallel resonator 22T. The thickness of the temperature compensating layer 20 in each series resonator 21T is selected so that the temperature coefficient of the resonant frequency of the series resonator 21T is brought close to zero. The thickness of the temperature compensating layer 20 in each parallel resonator 22T may be zero. As a result, in the transmission filter 97, the absolute value of the temperature coefficient at a frequency which is one nearer to the pass band of the reception filter 98 out of the frequency $f_{11}$ exhibiting the low frequency side attenuation extremum 111 and the frequency $f_{12}$ exhibiting the high frequency side attenuation extremum 112, that is, at the frequency $f_{12}$ exhibiting the high frequency side attenuation extremum 112 is smaller than the absolute value of the temperature coefficient at the other frequency, that is, at the frequency $f_{11}$ exhibiting the low frequency side attenuation extremum 111.

On the other hand, in the reception filter 98, the thickness of the temperature compensating layer 20 in each parallel resonator 22R is larger than the thickness of the temperature compensating layer 20 in each series resonator 21R. The thickness of the temperature compensating layer 20 in each parallel resonator 22R is selected so that the temperature coefficient of the resonant frequency of each parallel resonator 21R is brought close to zero. The thickness of the temperature compensating layer 20 in each series resonator 21R may be zero. As a result, in the reception filter 98, the absolute value of the temperature coefficient at a frequency which is one nearer to the pass band of the transmission filter 97 out of the frequency $f_{21}$ exhibiting the low frequency side attenuation extremum 121 and the frequency $f_{22}$ exhibiting the high frequency side attenuation extremum 122, that is, at the frequency $f_{21}$ exhibiting the low frequency side attenuation extremum 121 is smaller than the absolute value of the temperature coefficient at the other frequency, that is, at the frequency $f_{22}$ exhibiting the high frequency side attenuation extremum 122.

In the duplexer 90 having frequency characteristic shown in FIG. 5, particularly the change of the frequency $f_{12}$ at which the high frequency side attenuation extremum 112 appears in the transmission filter 97 and the change of the frequency $f_{21}$ at which the low frequency side attenuation extremum 121 appears in the reception filter 98 become issues. This is because the changes of these frequencies cause lowering of performance of the duplexer 90 for separating the transmission signal and the reception signal from each other. In this embodiment, the temperature compensating layer 20 can be provided for reducing the absolute values of the temperature coefficients at these frequencies.

On the other hand, the frequency $f_{11}$ at which the low frequency side attenuation extremum 111 appears in the transmission filter 97 can be selected so as to be far by a certain degree toward the low frequency side from the frequency at the low frequency side end of the frequency band of the transmission signal. In this case, it does not so matter if the absolute value of the temperature coefficient at the frequency $f_{11}$ is large to a certain degree. Similarly, the frequency $f_{22}$ at which the high frequency side attenuation extremum 122 appears in the reception filter 98 can be selected so as to be far by a certain degree toward the high frequency side from the frequency at the high frequency side end of the frequency band of the reception signal. In this case, it does not so matter if the absolute value of the temperature coefficient at the frequency $f_{22}$ is large to a certain degree.

Accordingly, in this embodiment, it does not so matter if the thickness of the temperature compensating layer 20 in each of the parallel resonators 22T in the transmission filter 97 or the thickness of the temperature compensating layer 20 in each of the series resonators 21R in the reception filter 98 is reduced. In this embodiment, the thickness of the temperature compensating layer 20 in each of the resonators 22T and 21T can be reduced to thereby suppress lowering of the electromechanical coupling coefficient of each of the resonators 22T and 21R caused by the temperature compensating layer 20. As a result, in accordance with this embodiment, reduction in pass band width of each of the filters 97 and 98 caused by the temperature compensating layer 20 can be suppressed.

As described above, in accordance with this embodiment, drawbacks due to variation in pass band caused by temperature change can be prevented while reduction in pass band width of each of the transmission filter 97 and the reception filter 98 in the duplexer 90 can be suppressed.

Next, an example of a method for producing a piezoelectric resonant filter including thin-film piezoelectric resonators each having the configuration shown in FIG. 7 will be described. In this example, an Si substrate having a surface cut and polished as a (100) face is used as the substrate 11. A 200 nm-thick silicon nitride ($SiN_x$) film is formed on each of upper (front) and lower (rear) surfaces of the substrate 11 by a chemical vapor deposition (CVD) method. The silicon nitride film formed on the upper surface of the substrate 11 serves as the upper barrier layer 13. The silicon nitride film formed on the lower surface of the substrate 11 serves as the lower barrier layer 12.

Then, an opening portion 12a is formed in the lower barrier layer 12 by reactive ion etching. The lower barrier layer 12 serves as a mask which will be used for forming the cave 11a in the substrate 11 by etching.

Then, a temperature compensating layer 20 of $SiO_2$ is formed on the upper barrier layer 13 by a sputtering method and a lift-off method. The lift-off method used in this example includes the steps of: forming a mask on an undercoat by photolithography; forming a thin film on the whole surface of the undercoat covered with the mask by a sputtering method; and lifting off the mask.

In this example, the temperature compensating layer 20 is formed in the following manner so that the temperature compensating layer 20 in each of the series resonators 21 is 300 nm thick whereas the temperature compensating layer 20 in each of the parallel resonators 22 is 50 nm thick. That is, in this example, a first $SiO_2$ layer 50 nm thick is formed on the whole upper surface of the upper barrier layer 13 by a sputtering method. Then, a second $SiO_2$ layer 250 nm thick is formed on a region of the first $SiO_2$ layer where each series resonator 21 will be formed, by a lift-off method.

Then, a 150 nm-thick lower electrode 14 of Pt is formed on the temperature compensating layer 20 by a vacuum vapor deposition method and a dry etching method.

Then, an 800 nm-thick piezoelectric thin film 15 of ZnO is formed on the lower electrode 14 by a sputtering method.

Then, an upper electrode 16 of Al is formed on the piezoelectric thin film 15 by a sputtering method and a wet etching method. In this example, the thickness of the upper electrode 16 in each series resonator 21 and the thickness of the upper electrode 16 in each parallel resonator 22 are set at 300 nm and 525 nm respectively so that the resonant frequency of each series resonator 21 and the resonant frequency of each parallel resonator 22 are made different from each other.

A portion which is part of the piezoelectric thin film 15 and which is disposed between the lower electrode 14 and the upper electrode 16 serves as a resonating portion.

Then, the substrate 11 masked with the lower barrier layer 12 is etched with KOH from the lower surface (rear surface) side to form a cave 11a. The substrate 11 as an Si substrate oriented to have a (100) face is subjected to anisotropic etching with KOH. As a result, the cave 11a gradually widened downward is formed in the substrate 11.

In this example, a piezoelectric resonant filter including two series resonators 21 and two parallel resonators 22 for forming a ladder-type filter circuit is produced. The circuit configuration of the piezoelectric resonant filter is a configuration obtained by removal of the second and fourth series resonators 21T from the circuit shown in FIG. 1 or a configuration obtained by removal of the first and third series resonators 21T from the circuit shown in FIG. 1.

Figure 8:
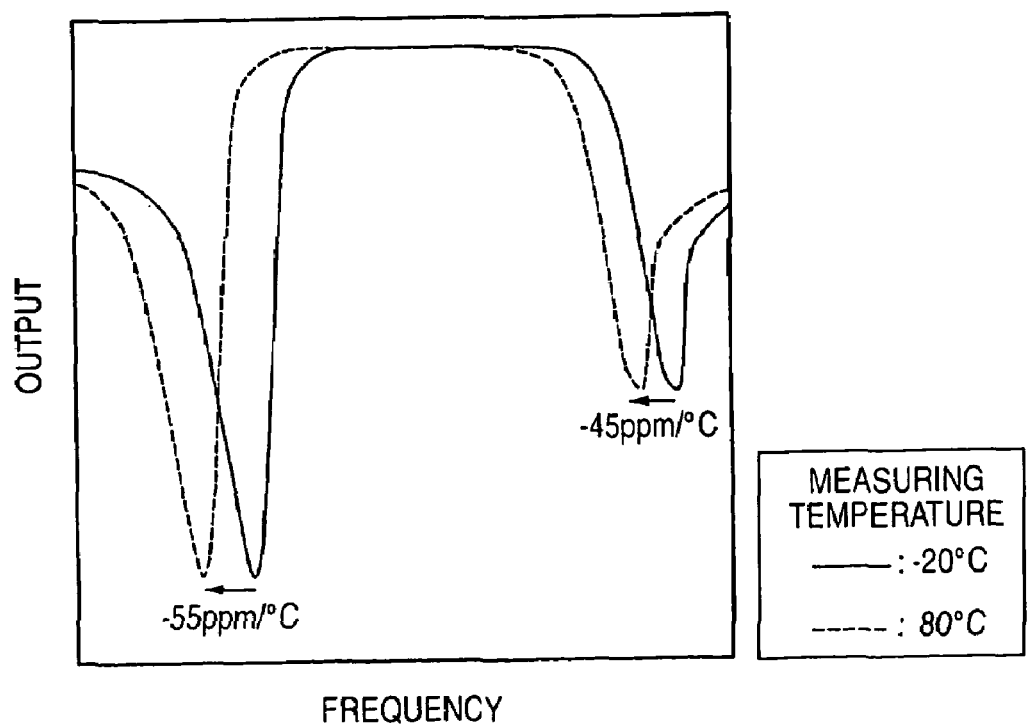
FIG. 8 is a characteristic graph showing a result of measurement of frequency characteristic of a piezoelectric resonant filter including thin-film piezoelectric resonators depicted in FIG. 7.

FIG. 8 shows a measured result of frequency characteristic of the piezoelectric resonant filter formed by the production method. In FIG. 8, the solid line shows frequency characteristic of the piezoelectric resonant filter at −20° C., and the broken line shows frequency characteristic of the piezoelectric resonant filter at 80° C. In this measured result, the temperature coefficient at the frequency where the low frequency side attenuation extremum appears is −55 ppm/° C. whereas the temperature coefficient at the frequency where the high frequency side attenuation extremum appears is −45 ppm/° C. It is obvious from the result in this example that the temperature coefficient at the frequency where the low frequency side attenuation extremum appears and the temperature coefficient at the frequency where the high frequency side attenuation extremum appears can be made different from each other.

A piezoelectric resonant filter is also produced in the same condition in the aforementioned example except that the temperature compensating layer 20 is disposed not between the upper barrier layer 13 and the lower electrode 14 but between the upper electrode 16 and the piezoelectric thin film 15 or on the upper electrode 16. The frequency characteristic of the piezoelectric resonant filter is measured to be nearly equal to that shown in FIG. 8.

Next, another example of the configuration of the thin-film piezoelectric resonator in this embodiment will be described with reference to FIG. 9. In the example shown in FIG. 9, the thin-film piezoelectric resonator includes a substrate 11, an acoustic multi-layer film 23 disposed on the substrate 11, a lower electrode 14 disposed on the acoustic multi-layer film 23, a piezoelectric thin film 15 disposed on the lower electrode 14, a temperature compensating layer 20 disposed on the piezoelectric thin film 15, and an upper electrode 16 disposed on the temperature compensating layer 20. The acoustic multi-layer film 23 is made of a laminate which is formed in such a manner that layers 23A each made of a high acoustic impedance material such as AlN and layers 23B each made of a low acoustic impedance material such as $SiO_2$ are laminated alternately.

The materials of the lower electrode 14, the piezoelectric thin film 15, the temperature compensating layer 20 and the upper electrode 16 are the same as those in the thin-film piezoelectric resonator having the configuration shown in FIG. 7.

Figure 9:
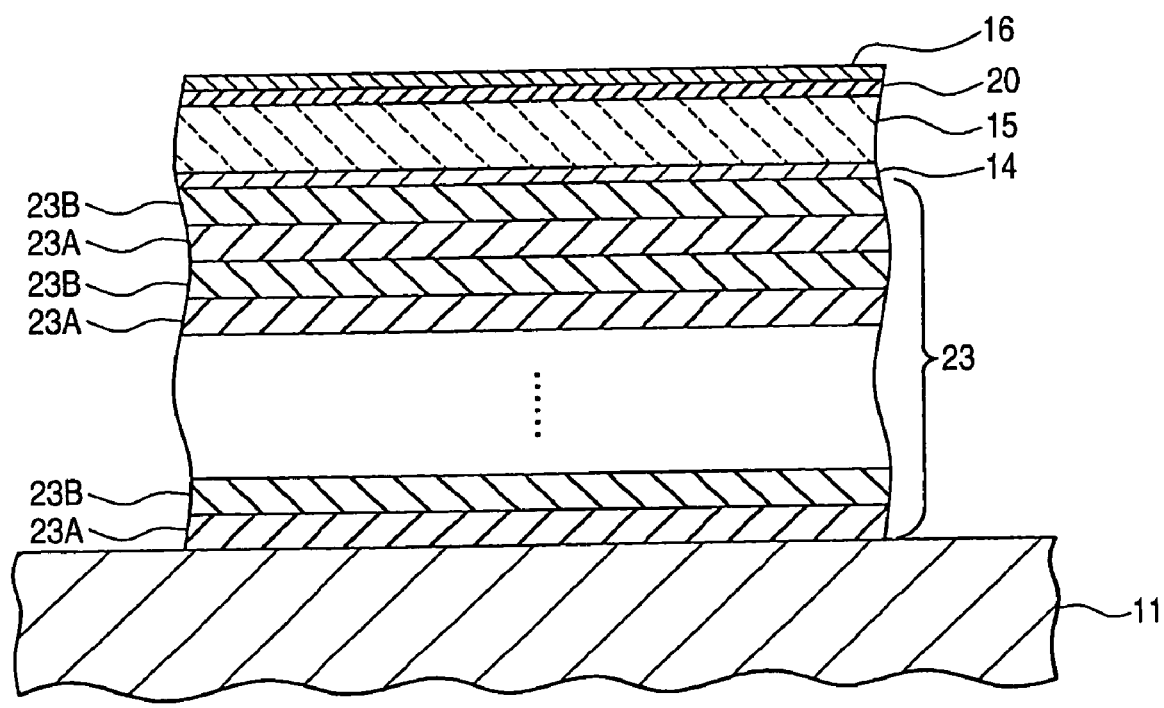
FIG. 9 is a sectional view showing another example of configuration of each thin-film piezoelectric resonator in the embodiment of the invention.

When a material such as $SiO_2$ having a temperature coefficient of elastic constant inverse in terms of plus/minus sign to the temperature coefficient of elastic constant of the material of the piezoelectric thin film 15 is used as the material of the layer 23B in the thin-film piezoelectric resonator having the configuration shown in FIG. 9, the layer 23B has a function of bringing the temperature coefficient of resonant frequency of the thin-film piezoelectric resonator close to zero. In this case, the layer 23B can be regarded as another temperature compensating layer than the temperature compensating layer 20. That is, it can be said that the layer 23B also serves as part of the temperature compensating layer. Accordingly, when the thin-film piezoelectric resonator having the configuration shown in FIG. 9 is used, the temperature coefficient of resonant frequency can be brought closer to zero.

Next, an example of a method for producing a piezoelectric resonant filter including thin-film piezoelectric resonators each having the configuration shown in FIG. 9 will be described. In this example, an Si substrate having a surface cut and polished as a (100) face is used as the substrate 11. Four AlN layers each having a thickness of 1.4 μm and four $SiO_2$ layers each having a thickness of 0.8 μm are laminated alternately on the substrate 11 by a sputtering method to form an acoustic multi-layer film 23 having eight layers in total.

Then, a 150 nm-thick lower electrode 14 of Pt is formed on the acoustic multi-layer film 23 by a vacuum vapor deposition method and a dry etching method.

Then, an 800 nm-thick piezoelectric thin film 15 of ZnO is formed on the lower electrode 14 by a sputtering method.

Then, a temperature compensating layer 20 of $SiO_2$ is formed on the piezoelectric thin film 15. In this example, the thickness of the temperature compensating layer 20 in each series resonator 21 and the thickness of the temperature compensating layer 20 in each parallel resonator 22 are set at 300 nm and 50 nm respectively. The method for forming the temperature compensating layer 20 is the same as the method for forming the temperature compensating layer 20 in the thin-film piezoelectric resonator having the configuration shown in FIG. 7.

Then, an upper electrode 16 of Al is formed on the temperature compensating layer 20 by a sputtering method and a wet etching method. In this example, the thickness of the upper electrode 16 in each series resonator 21 and the thickness of the upper electrode 16 in each parallel resonator 22 are set at 300 nm and 525 nm respectively to make the resonant frequency of the series resonator 21 and the resonant frequency of the parallel resonator 22 different from each other.

In this example, a piezoelectric resonant filter including two series resonators 21 and two parallel resonators 22 for forming a ladder-type filter circuit is produced. The circuit configuration of the piezoelectric resonant filter is a configuration obtained by removal of the second and fourth series resonators 21T from the circuit shown in FIG. 1 or a configuration obtained by removal of the first and third series resonators 21T from the circuit shown in FIG. 1.

Then, the frequency characteristic of the piezoelectric resonant filter formed by the aforementioned production method is measured. As a result of the measurement, the temperature coefficient at the frequency where the low frequency side attenuation extremum appears is −34 ppm/° C. whereas the temperature coefficient at the frequency where the high frequency side attenuation extremum appears is −24 ppm/° C. In the result of the measurement in this example, the absolute value of the temperature coefficient is reduced compared with the result of measurement in a piezoelectric resonant filter including thin-film piezoelectric resonators each having the configuration shown in FIG. 7. It is conceived that this is because the $SiO_2$ layers in the acoustic multi-layer film 23 in this example serve as part of the temperature compensating layer.

Although FIG. 9 shows the case where the temperature compensating layer 20 is disposed between the piezoelectric thin film 15 and the upper electrode 16, the temperature compensating layer 20 may be disposed on the upper electrode 16. Further, a piezoelectric resonant filter is produced in the same condition as in the aforementioned example except that the temperature compensating layer 20 is disposed on the upper electrode 16. The frequency characteristic of the piezoelectric resonant filter is measured to be nearly equal to that in the configuration shown in FIG. 9.

The invention is not limited to the aforementioned embodiment but various modifications may be made. For example, the piezoelectric resonant filter according to the invention is effective in the case where the rate of frequency change according to temperature change at one of the frequency where the low frequency side attenuation extremum appears and the frequency where the high frequency side attenuation extremum appears needs to be brought close to zero as well as the case where the piezoelectric resonant filter is used as each of the transmission filter and the reception filter in the duplexer. Accordingly, the piezoelectric resonant filter according to the invention may be used for the other purpose than the purpose of use as each of the transmission filter and the reception filter in the duplexer.

As described above, in the piezoelectric resonant filter according to the invention, the rate of frequency change according to temperature change at the first frequency where the low frequency side attenuation extremum appears is different from the rate of frequency change according to temperature change at the second frequency where the high frequency side attenuation extremum appears. Accordingly, the invention is effective in preventing drawbacks caused by variation in the pass band of the filter according to temperature change while suppressing reduction in the width of the pass band.

Further, each of the thin-film piezoelectric resonators may include an acoustic multi-layer film having a plurality of layers different in acoustic impedance and disposed on a surface of one of the excitation electrodes opposite to the piezoelectric thin film so that the excitation electrode is sandwiched between the acoustic multi-layer film and the piezoelectric thin film; and part of the plurality of layers in the acoustic multi-layer film serves as part of the temperature compensating layer. Accordingly, the invention is effective in bringing the rate of resonant frequency change according to temperature change closer to zero.

In the duplexer according to the present invention, the transmission filter has a first pass band decided on the basis of the first low frequency side attenuation extremum and the first high frequency side attenuation extremum. On the other hand, the reception filter has a second pass band decided on the basis of the second low frequency side attenuation extremum and the second high frequency side attenuation extremum. The rate of frequency change according to temperature change at a frequency which is one nearer to the second pass band out of the frequency where the first low frequency side attenuation extremum appears and the frequency where the first high frequency side attenuation extremum appears is lower than the rate of frequency change according to temperature change at the other frequency. Accordingly, the invention is effective in preventing drawbacks caused by variation in the pass band of the transmission filter according to temperature change while suppressing reduction in the width of the pass band of the transmission filter.

Further, each of the thin-film piezoelectric resonators may include an acoustic multi-layer film having a plurality of layers different in acoustic impedance and disposed on a surface of one of the excitation electrodes opposite to the piezoelectric thin film so that the excitation electrode is sandwiched between the acoustic multi-layer film and the piezoelectric thin film; and part of the plurality of layers in the acoustic multi-layer film serves as part of the temperature compensating layer. Accordingly, the invention is effective in bringing the rate of resonant frequency change according to temperature change closer to zero.

In the duplexer according to the present invention, the transmission filter has a first pass band decided on the basis of the first low frequency side attenuation extremum and the first high frequency side attenuation extremum. On the other hand, the reception filter has a second pass band decided on the basis of the second low frequency side attenuation extremum and the second high frequency side attenuation extremum. The rate of frequency change according to temperature change at a frequency which is one nearer to the first pass band out of the frequency where the second low frequency side attenuation extremum appears and the frequency where the second high frequency side attenuation extremum appears is lower than the rate of frequency change according to temperature change at the other frequency. Accordingly, the invention is effective in preventing drawbacks caused by variation in the pass band of the reception filter according to temperature change while suppressing reduction in the width of the pass band of the reception filter.

Further, each of the thin-film piezoelectric resonators may include an acoustic multi-layer film having a plurality of layers different in acoustic impedance and disposed on a surface of one of the excitation electrodes opposite to the piezoelectric thin film so that the excitation electrode is sandwiched between the acoustic multi-layer film and the piezoelectric thin film; and part of the plurality of layers in the acoustic multi-layer film serves as part of the temperature compensating layer. Accordingly, the invention is effective in bringing the rate of resonant frequency change according to temperature change closer to zero.

In the duplexer according to the present invention, the transmission filter has a first pass band decided on the basis of the first low frequency side attenuation extremum and the first high frequency side attenuation extremum. On the other hand, the reception filter has a second pass band decided on the basis of the second low frequency side attenuation extremum and the second high frequency side attenuation extremum. The rate of frequency change according to temperature change at a frequency which is one nearer to the second pass band out of the frequency where the first low frequency side attenuation extremum appears and the frequency where the first high frequency side attenuation extremum appears is lower than the rate of frequency change according to temperature change at the other frequency. The rate of frequency change according to temperature change at a frequency which is one nearer to the first pass band out of the frequency where the second low frequency side attenuation extremum appears and the frequency where the second high frequency side attenuation extremum appears is lower than the rate of frequency change according to temperature change at the other frequency. Accordingly, the invention is effective in preventing drawbacks caused by variation in the pass band of each of the transmission filter and the reception filter according to temperature change while suppressing reduction in the width of the pass band of each of the transmission filter and the reception filter.

Further, each of the thin-film piezoelectric resonators may include an acoustic multi-layer film having a plurality of layers different in acoustic impedance and disposed on a surface of one of the excitation electrodes opposite to the piezoelectric thin film so that the excitation electrode is sandwiched between the acoustic multi-layer film and the piezoelectric thin film; and part of the plurality of layers in the acoustic multi-layer film serves as part of the temperature compensating layer. Accordingly, the invention is effective in bringing the rate of resonant frequency change according to temperature change closer to zero.

What is claimed is:

1. A piezoelectric resonant filter having frequency characteristic exhibiting a low frequency side attenuation extremum and a high frequency side attenuation extremum arranged on opposite sides of a pass band, said piezoelectric resonant filter comprising:
   a plurality of thin-film piezoelectric resonators, each including a piezoelectric thin film having piezoelectric characteristic, and a pair of excitation electrodes disposed on opposite surfaces of said piezoelectric thin film for applying an excitation voltage to said piezoelectric thin film,
   wherein a rate of frequency change in accordance with temperature change at a first frequency at which said low frequency side attenuation extremum appears is different from that at a second frequency at which said high frequency side attenuation extremum appears.

2. A piezoelectric resonant filter according to claim 1, wherein said plurality of thin-film piezoelectric resonators are a combination of at least one series resonator and at least one parallel resonator for forming a ladder-type filter circuit;
   said series resonator exhibits said high frequency side attenuation extremum whereas said parallel resonator exhibits said low frequency side attenuation extremum;

at least one of said series resonator and said parallel resonator has a temperature compensating layer for bringing the rate of resonant frequency change in accordance with temperature change close to zero; and
thickness of said temperature compensating layer in said series resonator is different from thickness of said temperature compensating layer in said parallel resonators.

3. A piezoelectric resonant filter according to claim 2, wherein said temperature compensating layer is made of silicon dioxide.

4. A piezoelectric resonant filter according to claim 2, wherein each of said thin-film piezoelectric resonators further includes an acoustic multi-layer film having a plurality of layers different in acoustic impedance and disposed on a surface of one of said excitation electrodes opposite to said piezoelectric thin film so that said excitation electrode is sandwiched between said acoustic multi-layer film and said piezoelectric thin film.

5. A piezoelectric resonant filter according to claim 4, wherein part of said plurality of layers in said acoustic multi-layer film serves as part of said temperature compensating layer.

6. A duplexer connected to an antenna, comprising:
a transmission filter for passing a transmission signal but cutting off a reception signal, said transmission filter having frequency characteristic exhibiting a first low frequency side attenuation extremum and a first high frequency side attenuation extremum arranged on opposite sides of a first pass band; and
a reception filter for passing the reception signal but cutting off the transmission signal, said reception filter having frequency characteristic exhibiting a second low frequency side attenuation extremum and a second high frequency side attenuation extremum arranged on opposite sides of a second pass band different from said first pass band;
said transmission filter as at least one of said transmission filter and said reception filter includes a plurality of thin-film piezoelectric resonators, each of said thin-film piezoelectric resonators having a piezoelectric thin film having piezoelectric characteristic, and a pair of excitation electrodes disposed on opposite surfaces of said piezoelectric thin film for applying an excitation voltage to said piezoelectric thin film; and
the rate of frequency change in accordance with temperature change at a frequency which is one nearer to said second pass band out of a frequency exhibiting said first low frequency side attenuation extremum and a frequency exhibiting said first high frequency side attenuation extremum is lower than the rate of frequency change in accordance with temperature change at the other frequency exhibiting the other attenuation extremum.

7. A duplexer according to claim 6, wherein said plurality of thin-film piezoelectric resonators in said transmission filter are a combination of at least one series resonator and at least one parallel resonator for forming a ladder-type filter circuit;
said series resonators exhibits said first high frequency side attenuation extremum whereas said parallel resonators exhibits said first low frequency side attenuation extremum;
at least one of said series resonator and said parallel resonator has a temperature compensating layer for bringing the rate of resonant frequency change in accordance with temperature change close to zero; and
the thickness of said temperature compensating layer in said series resonator is different from the thickness of said temperature compensating layer in said parallel resonator.

8. A duplexer according to claim 7, wherein said temperature compensating layer is made of silicon dioxide.

9. A duplexer according to claim 7, wherein each of said thin-film piezoelectric resonators further includes an acoustic multi-layer film having a plurality of layers different in acoustic impedance and disposed on a surface of one of said excitation electrodes opposite to said piezoelectric thin film so that said excitation electrode is sandwiched between said acoustic multi-layer film and said piezoelectric thin film.

10. A duplexer according to claim 9, wherein part of said plurality of layers in said acoustic multi-layer film serves as part of said temperature compensating layer.

11. A duplexer connected to an antenna, comprising:
a transmission filter for passing a transmission signal but cutting off a reception signal, said transmission filter having frequency characteristic exhibiting a first low frequency side attenuation extremum and a first high frequency side attenuation extremum arranged on opposite sides of a first pass band; and
a reception filter for passing the reception signal but cutting off the transmission signal, said reception filter having frequency characteristic exhibiting a second low frequency side attenuation extremum and a second high frequency side attenuation extremum arranged on opposite sides of a second pass band different from said first pass band;
said reception filter as at least one of said transmission filter and said reception filter includes a plurality of thin-film piezoelectric resonators, each of said thin-film piezoelectric resonators having a piezoelectric thin film having piezoelectric characteristic, and a pair of excitation electrodes disposed on opposite surfaces of said piezoelectric thin film for applying an excitation voltage to said piezoelectric thin film; and
the rate of frequency change in accordance with temperature change at a frequency which is one nearer to said first pass band out of a frequency exhibiting said second low frequency side attenuation extremum and a frequency exhibiting said second high frequency side attenuation extremum is lower than the rate of frequency change in accordance with temperature change at the other frequency exhibiting the other attenuation extremum.

12. A duplexer according to claim 11, wherein said plurality of thin-film piezoelectric resonators in said reception filter are a combination of at least one series resonator and at least one of parallel resonator for forming a ladder-type filter circuit;
said series resonator exhibits said second high frequency side attenuation extremum whereas said parallel resonator exhibits said second low frequency side attenuation extremum;
at least one of said series resonator and said parallel resonator has a temperature compensating layer for bringing the rate of resonant frequency change in accordance with temperature change close to zero; and
the thickness of said temperature compensating layer in said serie resonators is different from the thickness of said temperature compensating layer in said parallel resonators.

13. A duplexer according to claim 12, wherein said temperature compensating layer is made of silicon dioxide.

14. A duplexer according to claim 12, wherein each of said thin-film piezoelectric resonators further includes an acoustic multi-layer film having a plurality of layers different in acoustic impedance and disposed on a surface of one of said excitation electrodes opposite to said piezoelectric thin film so that said excitation electrode is sandwiched between said acoustic multi-layer film and said piezoelectric thin film.

15. A duplexer according to claim 14, wherein part of said plurality of layers in said acoustic multi-layer film serves as part of said temperature compensating layer.

16. A duplexer connected to an antenna, comprising:
   a transmission filter for passing a transmission signal but cutting off a reception signal, said transmission filter having frequency characteristic exhibiting a first low frequency side attenuation extremum and a first high frequency side attenuation extremum arranged on opposite sides of a first pass band; and
   a reception filter for passing the reception signal but cutting off the transmission signal, said reception filter having frequency characteristic exhibiting a second low frequency side attenuation extremum and a second high frequency side attenuation extremum arranged on opposite sides of a second pass band different from said first pass band;
   each of said transmission filter and said reception filter includes a plurality of thin-film piezoelectric resonators, each of said thin-film piezoelectric resonators having a piezoelectric thin film having piezoelectric characteristic, and a pair of excitation electrodes disposed on opposite surfaces of said piezoelectric thin film for applying an excitation voltage to said piezoelectric thin film;
   the rate of frequency change in accordance with temperature change at a frequency which is one nearer to said second pass band out of a frequency exhibiting said first low frequency side attenuation extremum and a frequency exhibiting said first high frequency side attenuation extremum is lower than the rate of frequency change in accordance with temperature change at the other frequency; and
   the rate of frequency change in accordance with temperature change at a frequency which is one nearer to said first pass band out of a frequency exhibiting said second low frequency side attenuation extremum and a frequency exhibiting said second high frequency side attenuation extremum is lower than the rate of frequency change in accordance with temperature change at the other frequency exhibiting the other attenuation extremum.

17. A duplexer according to claim 16, wherein said plurality of thin-film piezoelectric resonators in said transmission filter are a combination of at least one of first series resonator and at least one of first parallel resonator for forming a ladder-type filter circuit;
   said first series resonator exhibits said first high frequency side attenuation extremum whereas said first parallel resonator exhibits said first low frequency side attenuation extremum;
   at least one of said first series resonator and said first parallel resonator has a temperature compensating layer for bringing the rate of resonant frequency change in accordance with temperature change close to zero;
   the thickness of said temperature compensating layer in said first series resonator is different from the thickness of said temperature compensating layer in said first parallel resonator;
   said plurality of thin-film piezoelectric resonators in said reception filter are a combination of at least one of second series resonator and at least one of second parallel resonator for forming a ladder-type filter circuit;
   said second series resonator exhibits said second high frequency side attenuation extremum whereas said second parallel resonator exhibits said second low frequency side attenuation extremum;
   at least one of said second series resonator and said second parallel resonator has a temperature compensating layer for bringing the rate of resonant frequency change in accordance with temperature change close to zero; and
   the thickness of said temperature compensating layer in said second series resonator is different from the thickness of said temperature compensating layer in said second parallel resonator.

18. A duplexer according to claim 17, wherein said temperature compensating layer is made of silicon dioxide.

19. A duplexer according to claim 17, wherein each of said thin-film piezoelectric resonators further includes an acoustic multi-layer film having a plurality of layers different in acoustic impedance and disposed on a surface of one of said excitation electrodes opposite to said piezoelectric thin film so that said excitation electrode is sandwiched between said acoustic multi-layer film and said piezoelectric thin film.

20. A duplexer according to claim 19, wherein part of said plurality of layers in said acoustic multi-layer film serves as part of said temperature compensating layer.

* * * * *